United States Patent [19]

Tanahashi

[11] Patent Number: 4,904,886
[45] Date of Patent: Feb. 27, 1990

[54] GATE ARRAY WITH HIGH DRIVING ABILITY CELLS

[75] Inventor: Toshio Tanahashi, Tokyo, Japan

[73] Assignee: NEC Corporation, Tokyo, Japan

[21] Appl. No.: 226,320

[22] Filed: Jul. 20, 1988

[30] Foreign Application Priority Data

Jul. 21, 1987 [JP] Japan ............................ 62-048

[51] Int. Cl.$^4$ ........................................ H03K 19/177
[52] U.S. Cl. ................................ 307/565; 307/270; 307/303.2; 307/468; 357/45
[58] Field of Search ............... 307/465, 468, 469, 443, 307/270, 303; 357/45, 51

[56] References Cited

U.S. PATENT DOCUMENTS

| | | | |
|---|---|---|---|
| 4,161,662 | 7/1979 | Malcolm et al. | 357/45 X |
| 4,523,106 | 6/1985 | Tanizawa et al. | 307/303 |
| 4,566,022 | 1/1986 | Kalter et al. | 307/468 X |
| 4,611,236 | 9/1986 | Sato | 357/45 |
| 4,750,027 | 6/1988 | Asami | 357/45 |
| 4,760,289 | 7/1988 | Eichelberger et al. | 307/303 X |

FOREIGN PATENT DOCUMENTS

| | | | |
|---|---|---|---|
| 0148363 | 9/1982 | Japan | 357/45 M |
| 0158644 | 8/1985 | Japan | 357/45 M |

*Primary Examiner*—David Hudspeth
*Attorney, Agent, or Firm*—Burns, Doane, Swecker & Mathis

[57] ABSTRACT

A gate array for implementing a digital integrated circuit includes first cells and second cells of different kinds which are selectively usable depending upon the application of the gate array, i.e. the first cells for applications which need only a low driving ability and the second cells for applications which need a high driving ability.

9 Claims, 23 Drawing Sheets

GATE ARRAY WITH HIGH DRIVING ABILITY CELLS

BACKGROUND OF THE INVENTION

The present invention relates to a gate array for implementing a digital integrated circuit which is applicable to a variety of systems such as a computer system.

A gate array of the kind described has an input/output (I/O) buffer area in a peripheral region thereof and an internal logic area which is surrounded by the peripheral I/O area. While the I/O area has a comparatively high driving ability, the internal logic area has a comparatively low driving ability. Arranged regularly in the internal logic area are one or more cells of a single kind each comprising a plurality of transistors, resistors, and wiring regions. The elements in each cell are interconnected by wiring to constitute a desired logic circuit.

A prerequisite with the above-described prior art gate array is that the individual cells in the internal logic area and, therefore, the transistors built in each of the cells be miniature enough to satisfy the demand for minimal current consumption. The driving ability available with the prior art gate array is therefore limited. A substantial load cannot be applied to the circuit unless an extra number of circuit stages are included for scattering the load, resulting in an increase in delay time of the circuit.

SUMMARY OF THE INVENTION

It is therefore an object of the present invention to provide a gate array capable of operating at a high speed with a minimum of delay time with no regard to the magnitude of a load.

It is another object of the present invention to provide a generally improved gate array.

A gate array of the present invention comprises a logic area having a first cell and a second cell which is greater in area than the first cell by an integral multiple, and an input/output buffer area surrounding the logic area for interfacing the logic area to outside for interchange of signals.

In accordance with the present invention, a gate array for implementing a digital integrated circuit includes first cells and second cells of different kinds which are selectively usable depending upon the application of the gate array, i.e. the first cells for applications which need only a low driving ability and the second cells for applications which need a high driving ability.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
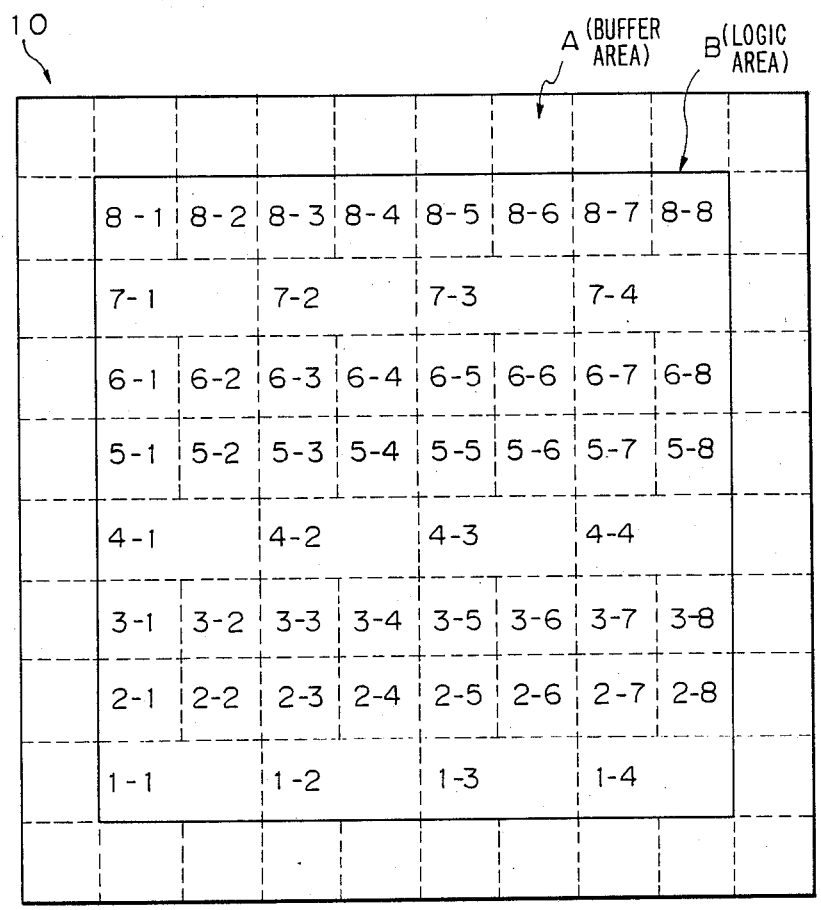
FIG. 1 is a diagram schematically showing a gate array in accordance with the present invention.

Referring to FIG. 1 of the drawings, a gate array embodying the present invention is shown and generally designated by the reference numeral 10. As shown, the gate array 10 is generally made up of an I/O buffer area. A and a logic area B defined inside the I/O buffer area A. Arranged in the logic area B are first cells 2-1 to 2-8, 3-1 to 3-8, 5-1 to 5-8, 6-1 to 6-8, and 8-1 and 8-8, and second cells 1-1 to 1-4, 4-1 to 4-4, and 7-1 to 7-4. The I/O buffer area A interfaces the gate array 10, i.e., internal logic area B to the outside for the interchange of signals.

Figure 2A:
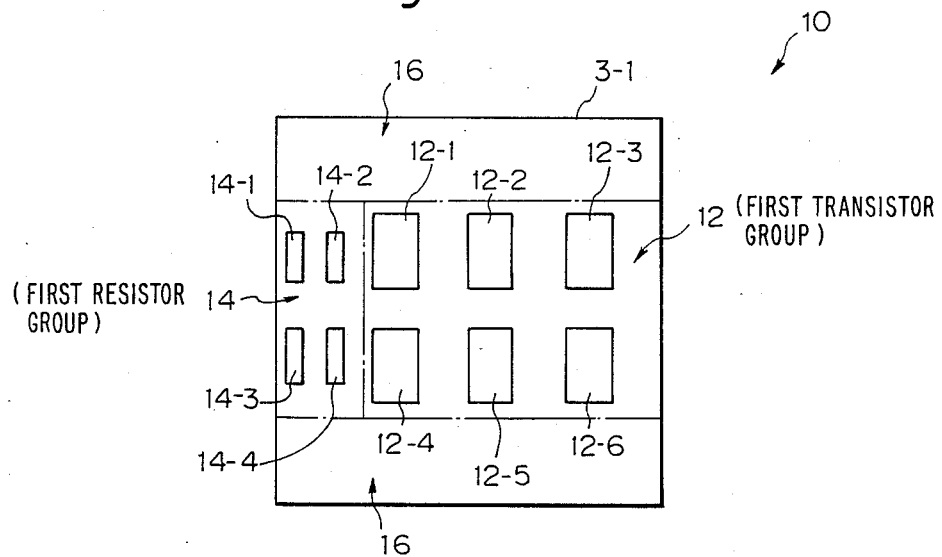
FIGS. 2A and 2B are diagrams each showing a different part of the gate array of FIG. 1 in an enlarged view.
Figure 2B:
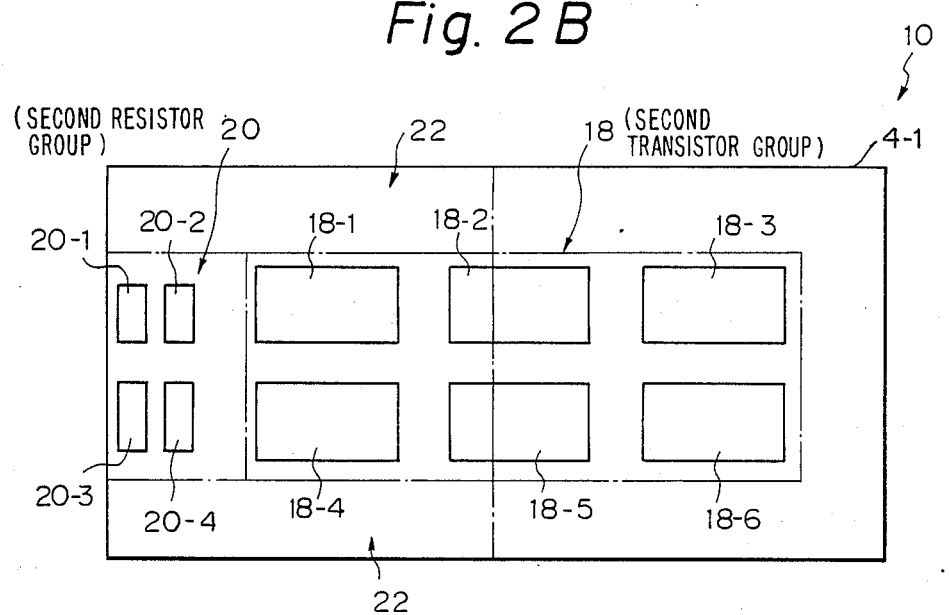

FIGS. 2A and 2B are enlarged views showing one of the first cells and one of the second cells, respectively. In these figures, the first cell 3-1 and the second cell 4-1 are shown by way of example. The first cell 3-1 is constituted by a first transistor group 12 (six transistors 12-1 to 12-6 in the illustrative embodiment), a first resistor group 14 (four resistors 14-1 to 14-4 in the illustrative embodiment), and wiring regions 16. Having a two times greater area than the first cell 3-1, the second cell 4-1 is made up of a second transistor group 18 (six transistors 18-1 to 18-6 in the illustrative embodiment), a second resistor group 20 (four resistors 20-1 to 20-4 in the illustrative embodiment), and wiring regions 22. The second transistor group 18 is larger than the first transistor group 12 and accommodated in an area which is two times as wide as the area in which the first group 12 is disposed. The resistance value of the second resistor group 20 is smaller than that of the first resistor group 14.

In the gate array 10, the first cells and the second cells are selectively used depending upon the application of the gate array 10. Specifically, the first cells are used for applications of the gate array 10 which need only a low driving ability, and the second cells are used for applications which need a high driving ability.

The resistors built in any of the first and second resistor groups 14 and 20 may have resistance values which are different from each other. If desired, the resistors constituting any of the first and second groups 14 and 20 may be distributed in the first or second transistor group 12 or 18 which is associated with the resistor group.

Further, in the event of automatic arrangement and wiring which is the advantage particular to a gate array, it is possible to dimension the second cells an integral multiple times greater than the first cells and yet define their wiring regions in the same positions.

Figure 3:
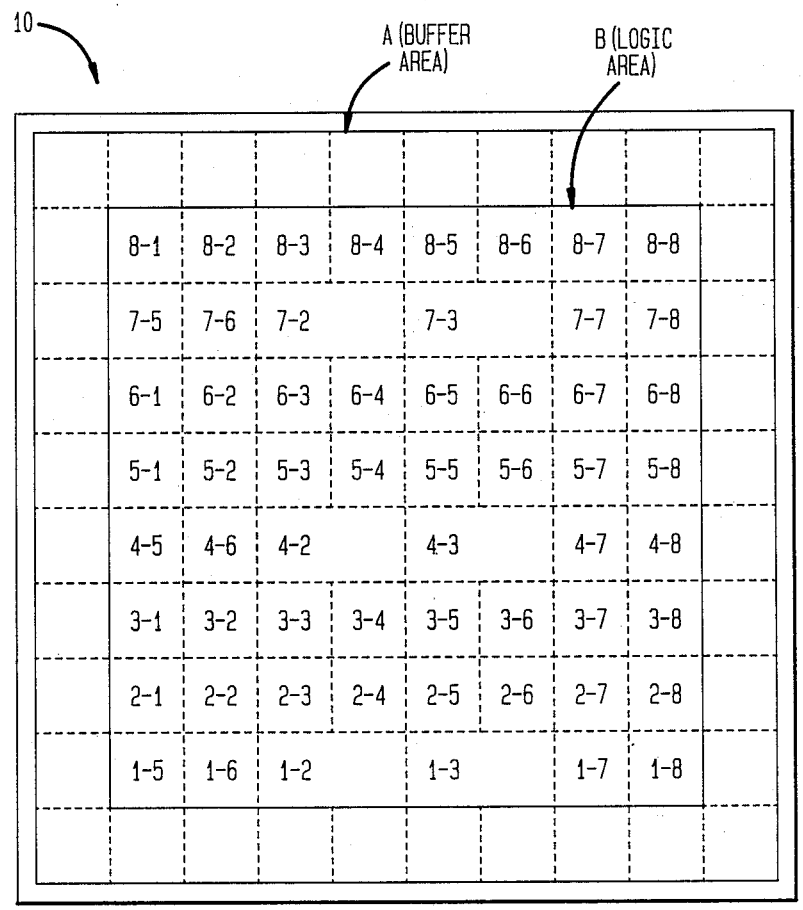
FIG. 3 is a diagram schematically showing an alternative embodiment of the present invention.

FIG. 3 shows an alternative embodiment of the present invention. The gate array shown in the figure has first cells 1-5 to 1-8, 4-5 to 4-8, and 7-5 to 7-8. The other legends designate the same sections as those shown in FIG. 1. In this particular embodiment, the second cells have a twice larger size than the first cells. This allows such a second cell to be located in a desired position by allocating to it an area corresponding to two first cells.

In summary, it will be seen that the present invention provides a gate array having two different kinds of cells which are different in driving ability and selectively usable depending upon the application of the gate array. The gate array therefore is operable at a high speed with a minimum of delay time with no regard to the magnitude of a load to be applied thereto.

Various modifications will become possible for those skilled in the art after receiving the teachings of the present disclosure without departing from the scope thereof.

What is claimed is:

1. A gate array comprising:
a logic area having a first cell and a second cell which is greater in area than said first cell by an integral multiple, wherein said first cell comprises a first transistor group, a first resistor group, and first wiring regions, and said second cell comprises a second transistor group, a second resistor group, and second wiring regions, and wherein said second transistor group is larger than said first transistor group, and said second resistor group has a resistance value lower than a resistance value of said first resistor group; and
an input/output buffer area surrounding said logic area for interfacing said logic area to the outside for interchange of signals.

2. A gate array as claimed in claim 1, wherein a plurality of resistors constituting said first resistor group have a same resistance value.

3. A gate array as claimed in claim 1, wherein a plurality of resistors constituting said second resistor group have a same resistance value.

4. A gate array as claimed in claim 1, wherein a plurality of resistors constituting said first resistor group have different resistance values from each other.

5. A gate array as claimed in claim 1, wherein a plurality of resistors consituting said second resistor group have different resistance values from each other.

6. A gate array as claimed in claim 1, wherein a plurality of resistors constituting said first resistor group are disposed in an area different from an area in which said first transistor group is disposed.

7. A gate array as claimed in claim 1, wherein a plurality of resistors constituting said second resistor group are disposed in an area different from an area in which said second transistor group is disposed.

8. A gate array as claimed in claim 1, wherein a plurality of resistors constituting said first resistor group are distributed in an area in which said first transistor group is disposed.

9. A gate array as claimed in claim 1, wherein a plurality of resistors constituting said second resistor group are distributed in an area in which said second transistor group is disposed.

* * * * *